(12) United States Patent
Velichko et al.

(10) Patent No.: US 7,337,088 B2
(45) Date of Patent: Feb. 26, 2008

(54) INTELLIGENT MEASUREMENT MODULAR SEMICONDUCTOR PARAMETRIC TEST SYSTEM

(75) Inventors: Sergey A. Velichko, Boise, ID (US); Michael J. Dorough, Meridian, ID (US); Robert G. Blunn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 278 days.

(21) Appl. No.: 10/131,934

(22) Filed: Apr. 25, 2002

(65) Prior Publication Data

US 2003/0028343 A1 Feb. 6, 2003

Related U.S. Application Data

(60) Provisional application No. 60/293,280, filed on May 23, 2001.

(51) Int. Cl.
*G06F 19/00* (2006.01)

(52) U.S. Cl. ........................... 702/122; 702/108

(58) Field of Classification Search ............... 702/81, 702/108, 121, 122, 127, 188; 324/500, 537, 324/754, 765; 438/14, 15
See application file for complete search history.

(56) References Cited

U.S. PATENT DOCUMENTS

| | | | |
|---|---|---|---|
| 4,517,512 A * | 5/1985 | Petrich et al. | 714/724 |
| 4,639,664 A | 1/1987 | Chiu et al. | 324/73.1 |
| 4,656,632 A | 4/1987 | Jackson | 371/20 |
| 4,896,269 A | 1/1990 | Tong | 700/101 |
| 4,985,988 A | 1/1991 | Littlebury | 29/827 |
| 5,078,257 A | 1/1992 | Carter, Jr. | 198/369.5 |
| 5,083,364 A * | 1/1992 | Olbrich et al. | 29/564 |
| 5,088,045 A | 2/1992 | Shimanaka et al. | 700/110 |
| 5,177,688 A | 1/1993 | Rentschler et al. | 700/101 |
| 5,206,582 A * | 4/1993 | Ekstedt et al. | 324/73.1 |
| 5,241,266 A | 8/1993 | Ahmad et al. | 714/733 |
| 5,360,747 A | 11/1994 | Larson et al. | 438/10 |
| 5,457,400 A | 10/1995 | Ahmad et al. | 324/763 |
| 5,483,175 A | 1/1996 | Ahmad et al. | 438/18 |
| 5,615,138 A | 3/1997 | Tanaka et al. | 702/81 |
| 5,726,920 A | 3/1998 | Chen et al. | 702/108 |

(Continued)

OTHER PUBLICATIONS

Fukuda, E.; Harakawa, S.; Ikeda, M.; "Advanced process control system description of an easy-to-use control system incorporating pluggable modules"; IEEE Intn'l Symposium on Semiconductor Manufacturing Conference Proceedings; Oct. 11-13, 1999; pp. 321-324.*

(Continued)

*Primary Examiner*—John Barlow
*Assistant Examiner*—Douglas N Washburn
(74) *Attorney, Agent, or Firm*—Schwegman, Lundberg & Woessner, P.A.

(57) ABSTRACT

An intelligent measurement modular semiconductor parametric test system comprises an engine control module. The engine control module is operable to communicate with a user via a user interface, and is further operable to communicate with and to control the state of at least one other module in the semiconductor parametric test system including pluggable modules. The engine control module is further operable to control test flow via a test monitor module based on data and control events received from an intelligent measurement module. Other modules in various embodiments comprise prober monitor modules.

15 Claims, 6 Drawing Sheets

U.S. PATENT DOCUMENTS

| | | | |
|---|---|---|---|
| 5,745,094 A * | 4/1998 | Gordon, II et al. | 700/121 |
| 5,787,190 A | 7/1998 | Peng et al. | 382/145 |
| 5,806,181 A | 9/1998 | Khandros et al. | 29/874 |
| 5,822,717 A | 10/1998 | Tsiang et al. | 702/108 |
| 5,845,234 A | 12/1998 | Testa et al. | 702/119 |
| 5,859,964 A | 1/1999 | Wang et al. | |
| 5,869,974 A | 2/1999 | Akram et al. | 324/754 |
| 5,962,862 A | 10/1999 | Evers et al. | 250/559.4 |
| 5,991,699 A | 11/1999 | Kulkarni et al. | |
| 6,031,382 A | 2/2000 | Nakaizumi | 324/754 |
| 6,113,646 A | 9/2000 | Holden | 716/4 |
| 6,119,125 A | 9/2000 | Gloudeman et al. | |
| 6,124,725 A | 9/2000 | Sato | |
| 6,208,904 B1 | 3/2001 | Mullen, Jr. | |
| 6,210,983 B1 | 4/2001 | Atchison et al. | |
| 6,240,331 B1 | 5/2001 | Yun | |
| 6,296,943 B1 | 10/2001 | Watanabe et al. | |
| 6,304,095 B1 * | 10/2001 | Miyamoto | 324/765 |
| 6,314,034 B1 * | 11/2001 | Sugamori | 365/201 |
| 6,331,783 B1 | 12/2001 | Hauptman | 324/765 |
| 6,362,013 B1 * | 3/2002 | Yoshimura | 438/14 |
| 6,370,487 B1 | 4/2002 | Dorough | |
| 6,383,825 B1 | 5/2002 | Farnworth et al. | 438/14 |
| 6,420,864 B1 * | 7/2002 | Abraham et al. | 324/158.1 |
| 6,445,199 B1 | 9/2002 | Satya et al. | 324/753 |
| 6,462,575 B1 | 10/2002 | Cram | 324/765 |
| 6,466,314 B1 | 10/2002 | Lehman | 356/237.1 |
| 6,486,492 B1 | 11/2002 | Su | 257/48 |
| 6,505,138 B1 * | 1/2003 | Leonard | 702/119 |
| 6,507,800 B1 | 1/2003 | Sheu | 702/117 |
| 6,536,006 B1 * | 3/2003 | Sugamori | 714/724 |
| 6,549,863 B1 | 4/2003 | Morinaga | |
| 6,556,938 B1 | 4/2003 | Rohrbaugh et al. | 702/117 |
| 6,563,331 B1 | 5/2003 | Maeng | |
| 6,567,770 B2 | 5/2003 | Dorough | |
| 6,590,408 B1 | 7/2003 | Cheng et al. | 324/764 |
| 6,598,210 B2 | 7/2003 | Miwa | |
| 6,618,682 B2 | 9/2003 | Bulaga et al. | 604/27 |
| 6,624,653 B1 | 9/2003 | Cram | 324/765 |
| 6,625,556 B1 | 9/2003 | Conboy et al. | |
| 6,629,282 B1 * | 9/2003 | Sugamori et al. | 714/734 |
| 6,639,417 B2 * | 10/2003 | Takao | 324/765 |
| 6,745,094 B1 * | 6/2004 | Harakawa et al. | 700/121 |
| 6,859,760 B2 | 2/2005 | Dorough | |
| 7,139,672 B2 | 11/2006 | Dorough et al. | |
| 7,162,386 B2 | 1/2007 | Dorough et al. | |
| 7,165,004 B2 | 1/2007 | Dorough et al. | |
| 2002/0000826 A1 | 1/2002 | Takao | 324/765 |
| 2002/0121915 A1 * | 9/2002 | Montull et al. | 324/765 |
| 2002/0152046 A1 * | 10/2002 | Velichko et al. | 702/117 |
| 2003/0028343 A1 | 2/2003 | Velichko | 702/122 |
| 2003/0200513 A1 * | 10/2003 | Reuter et al. | 716/4 |
| 2003/0212469 A1 * | 11/2003 | Wang et al. | 700/121 |
| 2003/0212523 A1 * | 11/2003 | Dorough et al. | 702/119 |
| 2004/0153979 A1 * | 8/2004 | Chang | 716/4 |
| 2004/0210413 A1 * | 10/2004 | Dorough et al. | 702/117 |
| 2005/0021273 A1 | 1/2005 | Dorough et al. | |
| 2006/0122803 A1 | 6/2006 | Dorough et al. | |
| 2006/0125509 A1 | 6/2006 | Dorough et al. | |
| 2006/0212253 A1 | 9/2006 | Velichko et al. | |
| 2007/0112538 A1 | 5/2007 | Velichko et al. | |

OTHER PUBLICATIONS

Blunn, R G., "Concurrent fault tolerant control of semiconductor measurement and testing", *2001 IEEE International Semiconductor Manufacturing Symposium*, 303.855us1,(Oct. 8-10, 2001),455-458.

Dorough, Michael J., et al., "Dynamic Adaptable Semiconductor Testing", *IEEE Proceedings of the 2002 International Symposium on Semiconductor Manufacturing, ISSM Catalog*, (2002),1-4.

Sedgewick, R., *Algorithms*, Second Edition, Addison-Wesley Publishing Company, Inc.,(1988),pp. 516-519.

Cheung, D. , et al., "The INMOS Integrated Paramatric Test and Analysis System", *Proceedings IEEE 1989 International Conference on Microelectronic Test Structures*, vol. 2(1), (Mar. 13-14, 1989),45-50.

Granieri, M. N., "System Engineering Considerations and Methodology for Effecting a Cohesive Functional/Parametric Testing Strategy", *IEEE Automatic Testing Conference*, (Sep. 25-28, 1989),1-8.

Hamilton, A. , et al., "An Expert System for Process Diagnosis [MOS Product Testing]", *Proceedings IEEE 1989 International Conference on Microelectronic Test Structures*, vol. 2(1), (Mar. 13-14, 1989),55-57.

Madge, R. , et al., "In Search of the Optimum Test Set—Adaptive Test Methods For Maximum Defect Coverage and Lowest Test Cost", *IEEE International Test Conference*, (Oct. 26-28, 2004).

Perez, R. A., et al., "Integrating Expert Systems With A Relational Database In Semiconductor Manufacturing", *IEEE Transactions on Semiconductor Manufacturing*, vol. 6(3), (Aug. 3, 1993),199-206.

Weber, C , "Standardization of CMOS Unit Process Development", *Proceedings IEEE 1989 International Conference on Microelectronic Test Structures*, (Mar. 13-14, 1989),39-44.

Gries, D., et al., "Chapter 9 - Predicate Calculus", *A Logical Approach to Discrete Math*, New York: Springer-Verlag, (1993), 157-71.

* cited by examiner

INTELLIGENT MEASUREMENT MODULAR SEMICONDUCTOR PARAMETRIC TEST SYSTEM

CROSS REFERENCE TO RELATED APPLICATIONS

The present invention is related to and claims priority from pending application Ser. No. 09/834,751, filed Apr. 13, 2001, titled "Concurrent control of semiconductor parametric testing".

The present invention further claims priority from provisional application Ser. No. 60/293,280, filed May 23, 2001, titled "Concurrent and fault-tolerant control of semiconductor parametric testing".

FIELD OF THE INVENTION

The invention relates generally to testing semiconductors, and more specifically to fault-tolerant modular control of semiconductor parametric tests.

BACKGROUND OF THE INVENTION

Fabrication of semiconductors typically comprises many steps, including creation of a silicon wafer, deposition of various materials onto the wafer, ion implantation into the wafer, etching material applied to the wafer, and other similar processes. These processes are used to create the electronic components and connections on the wafer that form a useful electronic circuit.

As these processes are performed on the wafer, the wafer may be subjected to parametric testing. Parametric testing involves testing the electronic parameters of the circuitry on the wafer, such as by applying current or voltage, and by measuring resistance, capacitance, current, voltage, or other such electrical parameters. These tests are used to ensure that a fabricated structure on the semiconductor meets the specifications and requirements of the semiconductor manufacturer and falls within acceptable tolerances.

Parametric testing can take place during the fabrication process to ensure that each stage of fabrication is successful, and is usually performed on the completed wafer to ensure that each completed circuit on the wafer is functional and meets specified performance criteria.

This parametric testing is typically performed with a parametric test system, which comprises several parts. Such systems may be capable of loading a wafer from a wafer tray to a wafer chuck, which is then positioned by a wafer positioner to a proper alignment under a test pin. Once the equipment has properly loaded and moved the wafer into position, parametric test instrumentation systems are initialized and operated to apply electrical signals, heat, and other stimuli as needed to the wafer. The test instrumentation also then takes measurements of parameters, such as impedance and current or voltage measurement, and the test system analyzes and records the results of the parametric tests.

Although parametric testing is typically used to verify the parameters or performance of production semiconductors, such testing can also be critical in investigating the usability or performance characteristics of new materials or new circuit structures. A wide variety of tests, including resistance, capacitance, transistor characteristic, thermal characteristic, and other tests enable characterization of these new materials and circuits, as well as verification of performance in a production environment.

Testing a single wafer can involve tens of thousands of measurements per wafer, with dozens of wafers per manufacturing lot or wafer tray loaded for test. Because this typically results in literally millions of parametric tests and measurements that must be performed per wafer lot, the complexity and speed of the parametric testing system is an important component in the efficient and profitable operation of a semiconductor fabrication facility.

Fabrication facilities desiring to stay efficient and competitive therefore regularly change or upgrade the equipment they use, including probers, wafer loaders, and various measurement instrumentation systems. However, reconfiguration of a semiconductor parametric test system to incorporate new equipment is typically time consuming and expensive, requiring extensive reconfiguration of hardware and software. Highly customized semiconductor parametric test systems have therefore traditionally been prohibitively expensive to produce, given the limited life and upgradeability of such systems.

It is therefore desirable to operate a semiconductor parametric test system that is both configurable and upgradable without extensive redesign of the entire semiconductor parametric test system.

SUMMARY OF THE INVENTION

A modular semiconductor parametric test system is provided, and comprises an engine control module. The engine control module is operable to communicate with a user via a user interface, and is further operable to communicate with and to control the state of at least one other module in the semiconductor parametric test system including pluggable modules. Other modules in various embodiments comprise test monitor modules, prober monitor modules, and measurement modules.

In one illustrative example of the present invention, a parametric test system includes an engine control module that is operable to control a parametric test via a pluggable test monitor module. The engine control module is further operable to control a prober via a pluggable prober monitor module, and to control other software and devices through other pluggable modules. The pluggable modules are independently replaceable when hardware or other parametric test system elements are changed, and facilitate incorporation of new elements into the example parametric test system without requiring extensive modification to the remainder of the system.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention provides a semiconductor parametric test system that is both configurable and upgradable without extensive redesign of the entire semiconductor parametric test system. This is accomplished in one embodiment of the invention via a modular semiconductor parametric test system having an engine control module. The engine control module of one embodiment provides a user interface such as through a personal computer console to facilitate control and monitoring. The engine control module is further operable in one embodiment to communicate with and to control the state of at least one other module in the semiconductor parametric test system, including pluggable modules. These other modules include test monitor modules, prober monitor modules, and measurement modules in various further embodiments of the invention.

Figure 1:
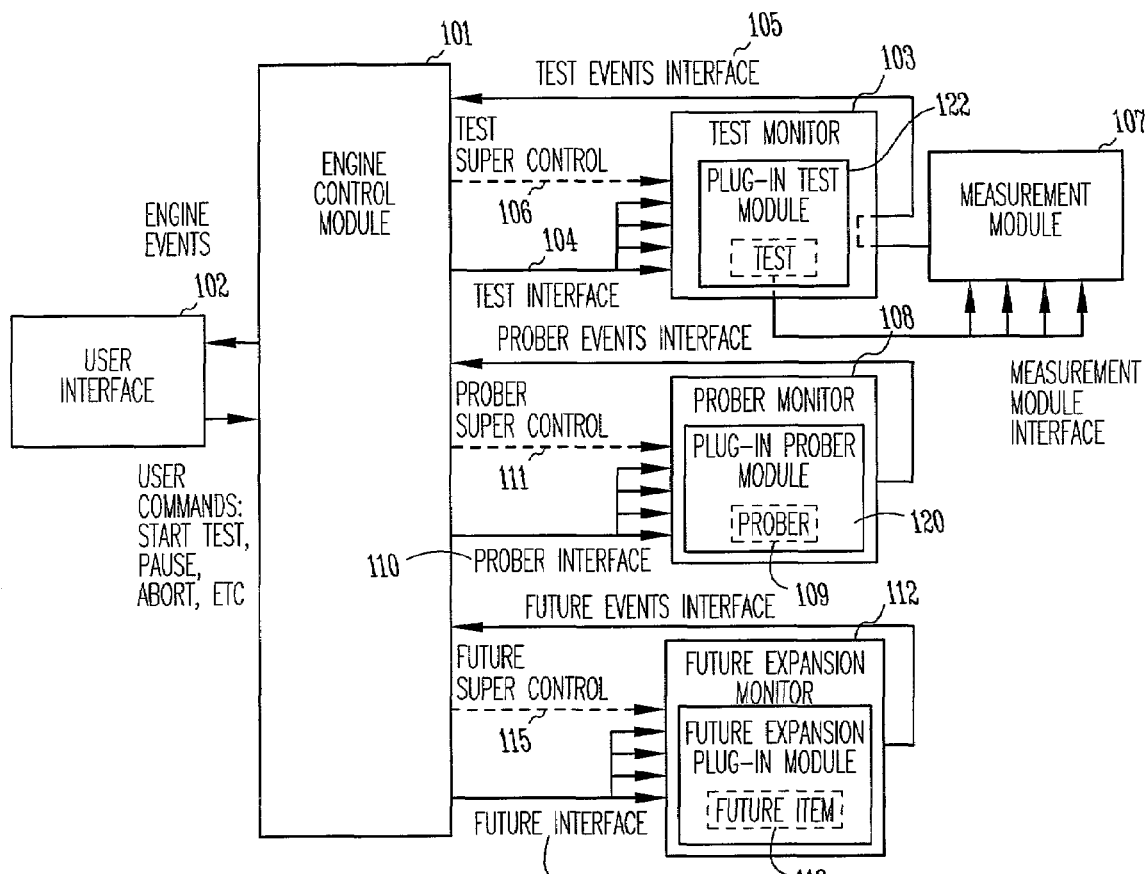
FIG. 1 shows an example configuration of a modular semiconductor parametric test system, consistent with an embodiment of the present invention.

FIG. 1 illustrates an example embodiment of such a modular parametric test control system. The engine control module 101 is operably coupled to a user interface 102, which facilitates operator control of the engine control module 101. The engine control module 101 provides the user interface 102 feedback on various parametric test system events, and receives parametric test system commands from the user interface 102. The parametric test system event feedback is presented to the operator, such as by text or graphics displayed on a video display, so that the operator can monitor the status of the test system. The user interface 102 of this example embodiment of the invention further provides the operator the ability to issue commands, such as start test, abort, pause, or other commands, to the engine control module 101. In an embodiment, the other commands may include, for example:

File Commands:
    Open an existing PSE (Parametric Shell Executive) document.
    Open a setup image—open any setup image for prober pin alignment.
    Save the PSE document.
    Save the PSE document with a new name.
    Save a snapshot of trace files for review of the problem.
    Save a setup image using graphic file format filter (such as *.jpg, *.tif, etc.).
    Print statistics on a lot run or wafers under test.
    Preview statistics.
    Print setup.
    Recent file.
    Exists.

Edit Commands
    Copy view. Examples of views: lot, wafer, statistics, test data, and modular system traces.

View Commands
    Custom view: 3-way novice view, 5-way advanced user view, and statistics math-oriented view.
    Test commands
    Start: start a new test.
    Pause: pause the wafer under test after a subsite test completes.
    Continue: continue testing wafer(s).
    Abort: abort the current wafer under test.
    Abort: abort the test due to an emergency software reset.

Prober Commands
    Prober Control Center: control prober.
    Unload all wafers and initialize the prober.
    Communication protocol trace history.
    Recover prober communications, for example prober super control 111 in FIG. 1. In an embodiment, protocols may include IEEE 480, TCP, or SECS, but any appropriate protocol may be used.

Statistics Commands
    Product health (product under test).
    On the fly statistics for single population sample.
    On the fly statistics for continuous population sample, on/off.

Engineering Commands
    Password protected (in an embodiment fabrication operators are not permitted in this menu.)

Engine Control Flow Option Commands
    Hardware management
    everything enabled
    no tester and no prober
    no prober
    no prober and no test (full emulation)
    Abort response management
    Context manage management
    Bypass lot validation/fabrication tracking
    All of the functions associated with the above commands by be delegated to the engine control module 101.

In a still further embodiment of the present invention, event feedback data provided to the user interface 102 from the engine control module 101 is stored such as on a personal computer's hard disk drive, so that it may be analyzed for other purposes and serve as a record of various test events. In an embodiment, the event feedback data may be transmitted to a remote system for parsing and insertion into a database, for example, by a background FTP (File Transfer Protocol) process.

The engine control module 101 of this example embodiment controls all aspects of the parametric test system operation, including performing functions such as loading a set of test parameters, initializing hardware, executing a test, and reporting results.

Various pluggable modules, such as the test monitor 103, are also operatively coupled to the engine control module 101. The test monitor 103 of this example embodiment is operable to load tests, unload tests, execute a test, and to support interactive operator debugging upon receiving commands from the engine control module 101. Likewise, users can request (queue) a pause and when the current subsite completes, they can compile or change their code, set break points, and then continue the test. These commands are in various embodiments of the invention created within the engine control module 101 as part of a sequence of tests, or received in the engine control module from an operator via the user interface 102. Commands are conveyed to the test monitor 103 via the test interface 104, and the test monitor 103 conveys test event information back to the engine control module 101 via the test event interface 105. The test monitor 103 in a further embodiment of the invention can receive super control instructions from the engine control module 101 via the test super control interface 106. The super control interface 106 is used to issue commands such as an emergency abort, to break test monitor module deadlocks, and to recover from other fault situations.

The test monitor 103 in one embodiment initializes data collection systems and initializes the parametric test instrumentation system, and then loads tests specific to the wafer under test. These tests are then performed and data is collected, until the tests are complete or the tests are stopped such as by a pause or abort. Upon completion of the tests, the test instrumentation is de-initialized, which includes such activities as removing applied voltages or currents from the test pins, and serves to prevent damaging the wafer as the pins are later positioned at another test site on the wafer.

The test monitor 103 is further connected to a measurement module 107 in the example embodiment of FIG. 1, which contains test data and test data attributes that can be manipulated to control test flow as well as to analyze the results of each test. For example, a measurement known to be a bad measurement can be omitted from a statistical summary for a particular wafer or lot using the measurement module 107. Further, the actual measured value in certain tests is replaced with an augmented value on occurrence of a particular circumstance, such as replacement of a measured impedance that is above a predetermined upper impedance limit with an infinite impedance value. The measurement module 107 of this embodiment will therefore contain a data structure containing the measured value, one or more measurement values such as the augmented or corrected value, bad measurement data, and other data. This data is provided to functions or state logic within the measurement module 107 that analyze the data and provide test flow control data. This data can then be relayed to the test monitor 103, to the engine control module 101, and/or a user interface, as appropriate, facilitating intelligent and fault-tolerant operation of the parametric test system under the control of the engine control module 101. All modules can log (control flow) for use by developers.

Analysis of the data collected in the measurement module 107 can lead to a determination that a fault condition exists, such as that a wafer has been improperly loaded. The measurement module 107 and test monitor 103 of some embodiments of the invention then perform an orderly abort under control of the engine control module 101 in a manner designed to prevent damaging the wafer. Also, attributes such as a bad wafer, a bad test site, or a bad wafer lot are determined in some embodiments by a certain number of failed tests or by other measurement module parameters, indicating that a particular set of tests is to be abandoned without completing all planned tests. This enables rejection of a bad wafer, wafer lot, or other group of semiconductors under test without completing all scheduled tests, resulting in a significant reduction in the time taken to test bad semiconductors.

The engine control module 101 is operable to receive other pluggable modules with other functions, such as the prober monitor module 108. The pluggable nature of such modules enables replacement of a module when new equipment or other modifications are made to the parametric test system without requiring a redesign of the entire system. For example, if the prober hardware 109 were replaced in the system illustrated in FIG. 1, only the plug-in prober module 120 would need to be replaced to integrate the new hardware into the parametric test system, leaving the remaining components such as the test monitor 103, engine control module 101, and user interface 102 substantially unchanged. This modular approach facilitates easy replacement of out-of-date hardware with newer hardware offering greater functionality or performance without the need to redesign the entire parametric test system.

An example of a prober 109 that may be plugged in is the TSK APM90 Fully Automatic Wafer Prober, which has a positioning accuracy of 5 microns and the following functions: automatic fine alignment, automatic pre-alignment, z-control, probing status check with simultaneous yield calculation, registration of device data, visual inspection, marking, multi-site probing, 9.8 inch touch panel color display, sampling test, wafer mapping, and logging of test results. In another embodiment, any appropriate prober may be used.

Examples of modules that may be plugged into the plug-in test module 122 are the Keithley Yield Station S900 and the Keithley Model 590 CV Analyzer, although in other embodiments any appropriate plug-in module may be used.

The Keithley Yield-Station S900 is a programmable automatic test system, controlled by a Personal Computer. It is capable of performing a wide range of tests requiring program-controlled electrical stimulus (DC and pulsed current and voltage) and measurement (current, voltage, and capacitance) and control of outboard devices such as probers and thermal chucks.

The Keithley Model 590 CV Analyzer is an instrument designed as a complete solution for individuals requiring capacitance and conductance versus voltage measurements in semiconductor testing. The unit can test devices at either 100 kHz or 1 MHz, depending on installed modules. The test voltage for both frequencies may be 45 mV RMS.

A typical parametric test system consistent with the present invention includes a test station or console providing a user interface, which is connected to a prober 109 that provides wafer movement functionality. The prober comprises a wafer loader, an auto-alignment system for aligning wafers, an optical character recognition system, and a probe assembly. The probe assembly comprises test pins, as well as a wafer chuck stage movement system that coordinates with the auto-alignment system to position the wafer under test. Once a particular subsite test is complete, the subsite test is deinitialized so that any applied voltage or current is removed, and the prober moves the test pins to a new subsite for a new subsite test.

The prober 109 of the example parametric test system is connected to parametric test instrumentation that includes a plug-in test module 122. The plug-in test module 122 may comprise a yield-station, a capacitance meter, and a digital multimeter. Further embodiments of a plug-in test module 122 include other electrical measurement functions such as an impedance analyzer and a thermometer. The plug-in test module 122 functions as a source for the data acquired via the test monitor 103. Further embodiments of a prober 109 include other functions such as a means to heat or cool the subsite under test.

The various elements of a parametric test system may be integrated with each other in ways not reflected in the modular nature of the elements of FIG. 1; for example, the wafer chuck of the of the integrated prober shown at 109 may be heated or cooled during test by the test monitor 103, by a future expansion monitor 112, or by another part of the parametric test system. The operation of these various modules is controlled and coordinated in some embodiments of the invention by the engine control module 101.

The prober monitor module 108 of the example embodiment of FIG. 1 provides a hardware control interface to the prober hardware 109 for the engine control module 101, so that the engine control module 101 can control the prober hardware 109. The prober monitor module 109 is operatively connected to the engine control module 101 via the prober interface 110, and can be controlled via supercontrol connection 111 to provide fault recovery or to provide other functions.

Should a module reach a deadlocked state, for example when a prober monitor module 108 is waiting for a signal from prober hardware 109 but no signal is returned, the prober monitor module 108 can become locked and unable to reply to normal commands received via prober interface 110. The supercontrol interface 111 provides the engine control module 101 a means for prober supercontrol, including in one embodiment commands to retry, resend the last command to the prober, abort and continue, abort and stop, or take other corrective action to break the deadlock, either automatically or as a result of user commands received via the user interface 102. When a supercontrol signal is received in the example described above, the prober monitor module 108 would stop waiting for a prober hardware reply and proceed to a new module state as directed.

When an abort signal is given (whether via supercontrol interface 111, the normal module interface 110, the test supercontrol interface 106, or the test interface 104) the abort may take various forms. An emergency abort causes immediate abort of all test and measurement activity, and is appropriate in the event of emergencies such as a fire, a misloaded wafer, or other such event. When the need to abort is somewhat less urgent, a controlled abort can be used. The controlled abort includes removing power from the test pins and taking other steps to ensure that the wafers under test are not unnecessarily damaged as a result of the abort. In one embodiment of the invention, a controlled abort comprises completing a subsite test already in progress before the test aborts. For further details on the operation of various modules consistent with various embodiments of the present invention, refer to copending and related application Ser. No. 09/834,751, filed Apr. 13, 2001, titled "Concurrent Control of Semiconductor Parametric Testing".

Similarly, other pluggable modules such as future expansion monitor 112 can later be added to the parametric test system to provide an interface to future item 113, such as new hardware. The future item 113 may be software or hardware. Various embodiment of such modules also utilize a future module interface 114 and a future supercontrol interface 115 to allow the engine control module 101 to control operation of the future item 113 via the future expansion monitor 112. Such potential future items include wafer handlers, prober or chuck hardware, or other elements desired to be added to the parametric test system.

Future expansion modules such as expansion module 112 need not provide an interface to hardware, but can provide an interface to software or other functionality represented by the future item 113. For example, the future item 113 in one example embodiment of the invention is a software analysis module that provides further data analysis or reporting functions to the parametric test system. A variety of modules interface with and operate under the control of the engine control module 101 in various embodiments, and all are within the scope of the present invention.

Figure 2A:
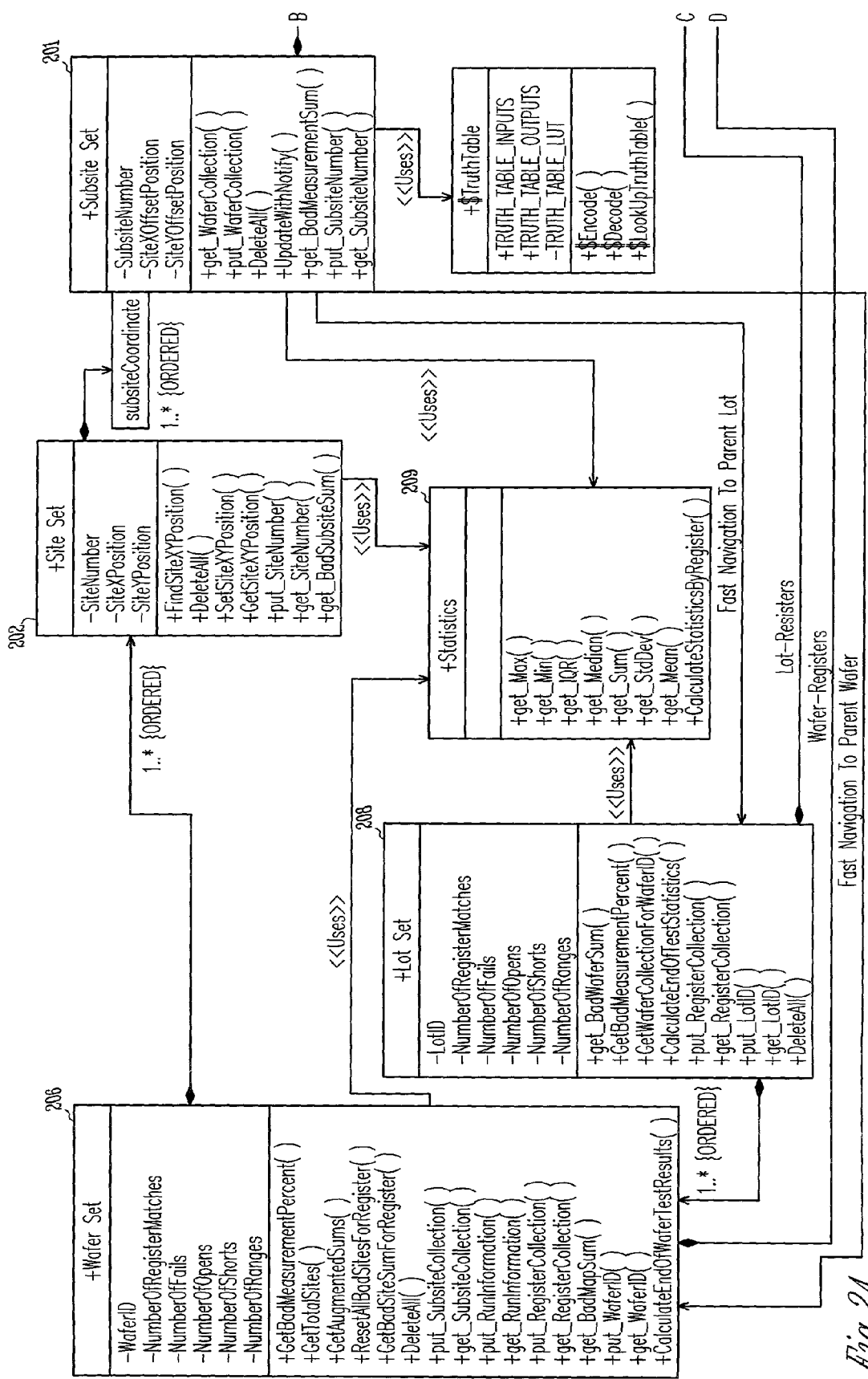
FIGS. 2A and 2B show a class diagram of a measurement collection including a measurement module in a semiconductor parametric test system, consistent with an embodiment of the present invention.
Figure 2B:
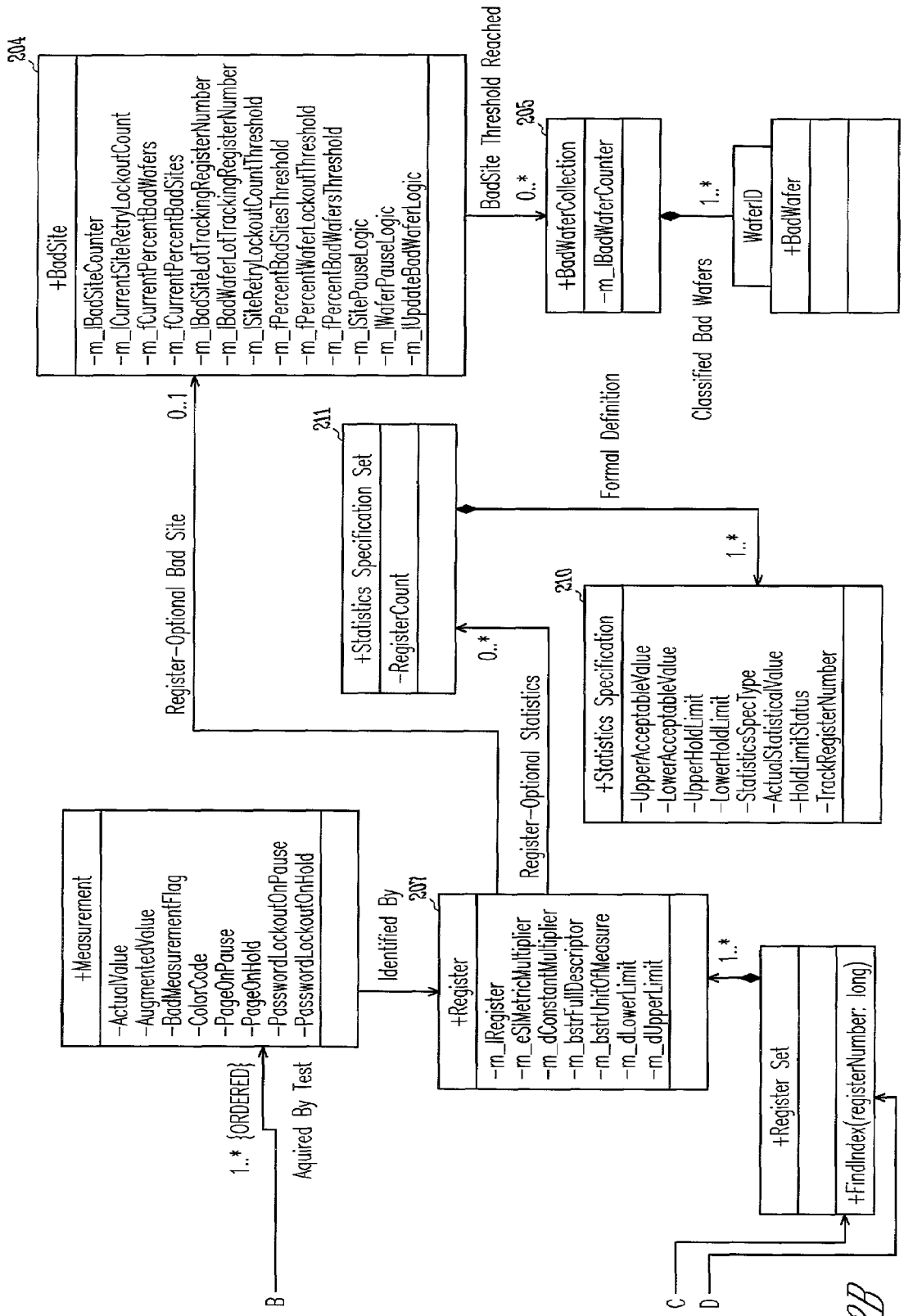

FIGS. 2A and 2B show a static class diagram of measurement collection in a semiconductor parametric test system, consistent with an embodiment of the present invention.

Primitives

Predicate logic offers an extension of prepositional logic that allows variables other than a type Boolean. A predicate-calculus formula is a Boolean expression in which some Boolean variable may be replaced by predicates and/or universal and existential quantification. The symbol $\forall$, which is read as "for all", is called the universal quantifier: "for all x such that R holds, P holds." The symbol $\exists$, which is read as "there exists", is called the existential quantifier: "there exists an x in the range R such that P holds."

Boolean Operators

| | |
|---|---|
| $\land$ | conjunction (and) |
| $\lor$ | disjunction (or) |
| $\neg$ | not |
| $\rightarrow$ | implication, if p then q |
| $=$ | equality |
| $\neq$ | inequality |
| $\equiv$ | equivalents |
| $\leq$ | less than or equal |
| $\geq$ | greater than or equal |

Types

| | |
|---|---|
| Z | integers: . . ., −3, −2, −1, 0, 1, 2, 3, . . . |
| N | natural numbers: 0, 1, 2, . . . |
| Z+ | positive numbers: 1, 2, 3, . . . |
| Z− | negative integers: −1, −2, −3, . . . |
| Q | rationals i/j for i, j integers, j ≠ 0 |
| R | real numbers |
| R+ | positive real numbers |
| B | booleans: true, false |
| ADT | abstract data type |

Set Theory

| | |
|---|---|
| ($\forall$ x \|R:P) | universal quantification |
| ($\exists$ x \|R:P) | existential quantification |
| set (t) | set of elements of type t |
| {$e_1$:t, . . . , $e_n$:t} | set enumeration, returns set (t) |
| x:t $\in$ S:set (t) | set membership, returns B |
| S:set (t) = T:set (t) | set equality, returns B |
| # S:set (t) | set size, returns N |
| {x \|R:B:E:t} | describe a set by stating exclusive properties of elements |
| $\in$ | where type t is an element of a set |
| $\notin$ | where type t is not an element of the set |
| $\cup$ | union |
| $\cap$ | intersection |
| $\subset$ | subset |
| $\supset$ | superset |

Coordinates

A coordinate is a 2-tuple pair ⟨x, y⟩, where x and y can be two-dimensional integer coordinates, Z, or two-dimensional real coordinates, R. Given the site index, and subsite index, the subsite coordinate can be found. Given the site index, a site coordinate can be found. These coordinate results are used to instruct the prober where the probe pins should contact with a specified location on the wafer. The coordinate can be an absolute distance or a relative offset distance. The unit of measure can be in die indices or microns. Sets S and SS are defined for Site and Subsite sets, respectively. These sets are arguments for predicates, subsiteCoordinate and siteCoordinate, which provided proof for existence of subsite and site coordinate.

⟨x, y⟩
(x: Z ∧y: Z) ∨(x:R ∧y: R)
subsiteIndex[1..ss]: Z+
siteIndex[1..s]: Z+
SubsiteCoordinate(siteIndex[s], subsiteIndex[ss]), returns ⟨x, y⟩
SiteCoordinate(siteIndex[s]), returns ⟨x, y⟩
S:set
SS:set
subsiteCoordinate(S:set, SS:set), returns B
siteCoordinate(S:set), returns B Register A register (R) 207 is an integer type uniquely identifying each resultant Electrical Test Result (ETR) real type value, as follows:
R:Z
ETR:R Measurement Each time that the probe pins make contact with the wafer, electrical connections with the test structures to the parametric test system are established, and tests are performed to acquire a Electrical Test Result (ETR). To provide unique identification, a Register (R) is associated with each ETR. In an embodiment, the ETR may be stored in memory and later transmitted to a database via a separate process. In another embodiment, each ETR is stored in memory and upon completion of each wafer being tested in the lot; the ETRs for each wafer are saved to storage and then transferred to a database.

A measurement is a 2-tuple pair ⟨R, ETR⟩. Rather than use primitive data types, an abstract data type, ADT, is defined to support the concept of a measurement. Given the Register, the predicate, measurement(R), is used to prove existence of a measurement, as follows:

⟨R, ETR⟩
Measurement(R): ADT, returns ETR
measurement(R), returns R

Subsite

A Subsite (SS) 201 is a set containing one or more ordered pairs of Measurements. A Subsite (SS) is located inside a site with a relative offset. At run time, the prober subsystem will move to each subsite coordinate per the site index and subsite index. For all Measurements, such that each Measurement is an element of Subsite set, the subsite coordinate can be found given the site set and subsite set as follows:

SS:set={(Measurement$_1$), (Measurement$_2$), . . . , (Measurement$_n$)}

(∀m$_n$:Measurement|m$_n$∈SS: subsiteCoordinate(S, SS))

Site

A Site (S) 202 contains one or more ordered Subsite (SS) sets. All Subsite (SS) elements in the Site (S) set are referenced by one site die coordinate. At run time, the prober subsystem moves to each site coordinate per the site index. For all Subsites, such that each Subsite is an element of the Site set, the site coordinate may be found given the site set as follows:

S:set={SS$_1$, SS$_2$, . . . , SS$_p$}

(∀SS$_p$|SS$_p$∈S: siteCoordinate(S))

Badsite

Each wafer may have a total number of Sites, totalSites on the wafer to be tested. The total number of badsites 204 and totalBadSites [R] indicate the number of bad measurements for a register R. Each wafer may keep its percentage of bad sites, percentBadSites [R], only for Registers that have been associated with a badsite. A register is associated with a Badsite when the parametric engineer creates the wafer test plan. For each wafer, the percentBadSites, is the total number of badsites for a wafer divided by the total number of sites on the wafer for a register R. The parametric engineer may predefine the percentBadSiteThreshold for each register when the wafer test plan is created. The percentBadSiteThreshold may be used at runtime to compare the percentBadSites against for a register R. At the start of each wafer test, the totalBadsites counter may be reset to zero.

totalSites: Z=count( )
totalBadsites [R]: Z
percentBadSites [R]: R
percentBadSites [R]=totalBadsites[R]/totalSites*100%
percentBadSiteThreshold: R If the percentBadSites exceeds the percentBadSiteThreshold threshold, then the system may cause a variety of output actions:

Pause the test.
Pause and notify the parametric engineer. For example, send a page and/or email.
Lockout the operator on the badsite and request the operator to enter a password to continue.
Put the lot on hold.

Badwafer

The total number of badwafers 205, totalBadWafers, indicates the number of bad wafers that exist in a lot run. The parametric engineer may predefine the percentBadWaferThreshold for each Badwafer when the wafer test plan is created. The percentBadWaferThreshold may be used at runtime to compare against the percentBadWafers. In an embodiment, the totalBadWafers must persist across all wafers in the lot.

totalBadWafers: Z
percentBadWafers: R
percentBadWafers=totalBadWafers/totalBadWafers*100%
percentBadWaferThreshold: R If the percentBadWafers exceeds the percentBadWaferThreshold threshold, then the system may cause a variety of output actions:

Pause the test.
Pause and notify the parametric engineer. For example, send a page and/or an email.
Lockout the operator on a badwafer and request the operator to enter a password to continue.
Put the lot on hold.

The wafer 206 has statistics knowledge for all nested sets. The lot 208 has statistics knowledge for all nested sets.

The statistics 209 is used to compute statistics for a wafer 206, lot 208, site 202, or subsite 201.

The wafer test plan drives the statistics of the Statistics Specification Set 211. The wafer test plan may be defined as follows:

Keywords and Values
FileName
Name of the WTP file.
Default=none.
For example: fileName=D52D_58.WTP Version
　　WTP file version number.
　　Default=0.
　　For example: version=1

DesignID
　　Specifies the ID of the die design and is the value of the keyword used to retrieve a list of valid Registers by the Test Development Tool.
　　Default=none.
　　For example: DesignID=D78E InitialValue
　　Specifies the initial value for each measurement (register) in a wafer collection.
　　Default=998.0//Augmented Value Not Applicable
　　For example: InitialValue=−1.0

Origin
　　Location of the wafer origin (TL=Top-Left, TR=Top-Right, BL=Bottom-Left, BR=Bottom-Right).
　　Default=top-left.
　　For example: origin=TR Units
　　Specification of the measurement system (E=English, M=Metric).
　　Default=none.
　　For example: units=M WaferDiameter
　　Diameter of the wafer in inches or mm. Keyword units specifies the measurement system.
　　Default=0.
　　For example: waferDiameter=200

DieSize
　　Comma delimited horizontal and vertical size of the die in microns
　　Default=0, 0
　　For example: DieSize=3646, 7892

NoCols
　　Number of die columns in the wafer
　　Default=0.
　　For example: NoCols=53

NoRows
　　Number of die rows in the wafer
　　Default=0.
　　For example: NoRows=24

ReticleFrameSize
　　Comma delimited horizontal and vertical size of the reticle frame in dies.
　　Default=0, 0.
　　For example: ReticleFrameSize=1, 3

ReticleShift
　　Comma delimited horizontal and vertical shift of the central reticle frame center from the center of the wafer in microns.
　　Default=0.0, 0.0
　　For example: ReticleShift=0.0000, 6994.0

Flat
　　Position of the wafer flat or notch (L=Left, R=Right, T=Top, B=Bottom).
　　Default=Top.
　　For example: flat=T SetupDie
　　Column and Row coordinate of the setup test site from the origin on the wafer.
　　Default=0, 0.
　　For example: FirstDie=4, 20

ReferenceDie
　　Column and Row coordinate of the reference test site from the origin on the wafer.
　　Default 0, 0.
　　For example: Reference=3, 14

Boundary
　　This keyword specifies wafer boundary tolerance in millimeters (mm) in an embodiment. Test sites outside of the boundary tolerance are not accepted. Boundary values may be either positive or negative. A positive boundary tolerance may specify an acceptable area outside of the wafer. A negative boundary tolerance may specify an exclusion area inside of the wafer.
　　Default=0.0.
　　For example: //exclude 2 mm from the edge and everything outside of the wafer.
　　Boundary=−2.0

Register
　　Specifies a register. The format of the specification may be a register number, a comma, and a description. In an embodiment, all other specification parameters may be optional. Comma, a flag for the final statistics format display (C=Chart table format, none is linear format, default is none), comma, unit of measure (e.g., KOhm, default is none), comma, metric multiplier (ex. Kilo) multiplied (*) or divided (/) by an optional constant, comma, Lower Limit, comma, Upper Limit. A list of valid metric multipliers may include: Exe, Peta, Tera, Giga, Mega, Kilo, Hecto, Deca, Deci, Centi, Milli, Micro, Nano, Angstrom, Pico, Femto, Atto. In an embodiment, an optional constant may be any floating form number. For example, Kilo/10.0 or Kilo*5.0. The presence of a metric multiplier and an accompanying constant may influence the future results in the following way: being checked, the register value will be divided by metric multiplier and optionally multiplied (*) or divided (/) by the accompanying constant if such a constant is specified. The default may be none, which means the multiplier is equal to 1.0. In an embodiment, the Lower and Upper Limits must be expressed in the same units as register itself. For example, if the unit of measure was specified as KOhm, the metric multiplier was specified as Kilo, and the Lower Limit is to be 2.4 KOhm and the Upper Limit is to be 4.7 KOhm, then limits need to be specified as 2.4 and 4.7 correspondingly. The default for the Lower Limit may be −1E30, and the default for the Upper Limit may be 1E30.
　　For example:
　　　　register=305, GOX AF1 to AF2 Poly1 Resistor, C
　　　　register=305, AF2 Poly1 Resistor,, KOhm, Kilo, 2.4, 4.7
　　　　register=306, AF2 Poly2 Resistor,, KOhm, Kilo/10.0, 2.4, 4.7
　　　　register=307, AF2 Poly3 Resistor,, KOhm, Kilo*5.0
　　　　register=308, AF2 Poly4 Resistor,, KOhm, Mega
　　　　register=309, AF2 Poly5 Resistor
　　There may be two values that are stored for each measurement: Actual Value and Augmented Value. In an embodiment, all measurements may be initialized to the following: Actual Value=998 (default) or the value specified by InitialValue keyword, and Augmented Value=NA (not applicable). Upon registering each measurement with check limits, it may be scrutinized and evaluated according to the following evaluation of measurement with check limits when a change to limits is specified:

When Measured Value is >Upper Valid Limit, Change Key is ChangeToLimit, OpenHighLow Key is OpenHigh, Converted Actual Value is Upper Limit, and Bad Measurement is YES, then Augmented Value is none.

When Measured Value is Between Valid Limits, Change Key is ChangeToLimit, OpenHighLow Key is OpenHigh, Converted Actual Value is Measured Value, and Bad Measurement is NO, then Augmented Value is none.

When Measured Value is <Lower Valid Limit, Change Key is ChangeToLimit, OpenHighLow Key is OpenHigh, Converted Actual Value is Lower Limit, and Bad Measurement is YES, then Augmented Value is none When Measured Value is 999, Change Key is ChangeToLimit, OpenHighLow Key is OpenHigh, Converted Actual Value is Upper Limit, and Bad Measurement is YES, then Augmented Value is none.

When Measured Value is −999, Change Key is ChangeToLimit, OpenHighLow Key is OpenHigh, Converted Actual Value is Lower Limit, and Bad Measurement is YES, then Augmented Value is none.

When Measured Value is 998, Change Key is ChangeToLimit, OpenHighLow Key is OpenHigh, Converted Actual Value is 998, and Bad Measurement is YES, then Augmented Value is NA.

When Measured Value is >Upper Valid Limit, Change Key is NoChange, OpenHighLow Key is OpenHigh, Converted Actual Value is Measured Value, and Bad Measurement is YES, then Augmented Value is none.

When Measured Value is Between Valid Limits, Change Key is NoChange, OpenHighLow Key is OpenHigh, Converted Actual Value is Measured Value, and Bad Measurement is NO, then Augmented Value is none.

When Measured Value is <Lower Valid Limit, Change Key is NoChange, OpenHighLow Key is OpenHigh, Converted Actual Value is Measured Value, and Bad Measurement is YES, then Augmented Value is none.

When Measured Value is 999, Change Key is NoChange, OpenHighLow Key is OpenHigh, Converted Actual Value is 999, and Bad Measurement is YES, then Augmented Value is OPEN.

When Measured Value is −999, Change Key is NoChange, OpenHighLow Key is OpenHigh, Converted Actual Value is −999, and Bad Measurement is YES, then Augmented Value is SHORT.

When Measured Value is 998, Change Key is NoChange, OpenHighLow Key is OpenHigh, Converted Actual Value is 998, and Bad Measurement is YES, then Augmented Value is NA.

When Measured Value is >Upper Valid Limit, Change Key is Change, OpenHighLow Key is OpenHigh, Converted Actual Value is 999, and Bad Measurement is YES, then Augmented Value is OPEN.

When Measured Value is Between Valid Limits, Change Key is Change, OpenHighLow Key is OpenHigh, Converted Actual Value is Measured Value, and Bad Measurement is NO, then Augmented Value is none.

When Measured Value is <Lower Valid Limit, Change Key is Change, OpenHighLow Key is OpenHigh, Converted Actual Value is −999, and Bad Measurement is YES, then Augmented Value is SHORT.

When Measured Value is 999, Change Key is Change, OpenHighLow Key is OpenHigh, Converted Actual Value is 999, and Bad Measurement is YES, then Augmented Value is OPEN.

When Measured Value is −999, Change Key is Change, OpenHighLow Key is OpenHigh, Converted Actual Value is −999, and Bad Measurement is YES, then Augmented Value is SHORT.

When Measured Value is 998, Change Key is Change, OpenHighLow Key is OpenHigh, Converted Actual Value is 998, and Bad Measurement is YES, then Augmented Value is NA.

When Measured Value is >Upper Valid Limit, Change Key is ChangeToLimit, OpenHighLow Key is OpenLow, Converted Actual Value is Lower Limit, and Bad Measurement is YES, then Augmented Value is none.

When Measured Value is Between Valid Limits, Change Key is ChangeToLimit, OpenHighLow Key is OpenLow, Converted Actual Value is Measured Value, and Bad Measurement is NO, then Augmented Value is none.

When Measured Value is <Lower Valid Limit, Change Key is ChangeToLimit, OpenHighLow Key is OpenLow, Converted Actual Value is Upper Limit, and Bad Measurement is YES, then Augmented Value is none.

When Measured Value is 999, Change Key is ChangeToLimit, OpenHighLow Key is OpenLow, Converted Actual Value is Lower Limit, and Bad Measurement is YES, then Augmented Value is none.

When Measured Value is −999, Change Key is ChangeToLimit, OpenHighLow Key is OpenLow, Converted Actual Value is Upper Limit, and Bad Measurement is YES, then Augmented Value is none.

When Measured Value is 998, Change Key is ChangeToLimit, OpenHighLow Key is OpenLow, Converted Actual Value is 998, and Bad Measurement is YES, then Augmented Value is NA.

When Measured Value is >Upper Valid Limit, Change Key is NoChange, OpenHighLow Key is OpenLow, Converted Actual Value is Measured Value, and Bad Measurement is YES, then Augmented Value is none.

When Measured Value is Between Valid Limits, Change Key is NoChange, OpenHighLow Key is OpenLow, Converted Actual Value is Measured Value, and Bad Measurement is NO, then Augmented Value is none.

When Measured Value is <Lower Valid Limit, Change Key is NoChange, OpenHighLow Key is OpenLow, Converted Actual Value is Measured Value, and Bad Measurement is YES, then Augmented Value is none.

When Measured Value is 999, Change Key is NoChange, OpenHighLow Key is OpenLow, Converted Actual Value is 999, and Bad Measurement is YES, then Augmented Value is OPEN.

When Measured Value is −999, Change Key is NoChange, OpenHighLow Key is OpenLow, Converted Actual Value is −999, and Bad Measurement is YES, then Augmented Value is SHORT.

When Measured Value is 998, Change Key is NoChange, OpenHighLow Key is OpenLow, Converted Actual Value is 998, and Bad Measurement is YES, then Augmented Value is NA.

When Measured Value is >Upper Valid Limit, Change Key is Change, OpenHighLow Key is OpenLow, Converted Actual Value is −999, and Bad Measurement is YES, then Augmented Value is SHORT.

When Measured Value is Between Valid Limits, Change Key is Change, OpenHighLow Key is OpenLow, Converted Actual Value is Measured Value, and Bad Measurement is NO, then Augmented Value is none.

When Measured Value is <Lower Valid Limit, Change Key is Change, OpenHighLow Key is OpenLow, Converted Actual Value is 999, and Bad Measurement is YES, then Augmented Value is OPEN.

When Measured Value is 999, Change Key is Change, OpenHighLow Key is OpenLow, Converted Actual Value is 999, and Bad Measurement is YES, then Augmented Value is OPEN.

When Measured Value is −999, Change Key is Change, OpenHighLow Key is OpenLow, Converted Actual Value is −999, and Bad Measurement is YES, then Augmented Value is SHORT.

When Measured Value is 998, Change Key is Change, OpenHighLow Key is OpenLow, Converted Actual Value is 998, and Bad Measurement is YES, then Augmented Value is NA.

Note 1: In an embodiment, statistics are only performed when the augmented value=none.

Note 2: Acceptable Limits may determine the range allowable for statistical measurements.

Note 3: Valid Limits may determine whether the measurement is classified as a bad measurement.

The following keywords specify what statistics of the statistics specification 209 of FIG. 2B are to be performed for a register. In an embodiment, these keywords must follow the register specification and represent the statistics that are performed on each particular register. Each of them may have the following format:

keyword=LAV, UAV, LHL, UHL, LT where:

LAV—Lower Acceptable Value—determines the lower range for a register value to be included into statistic calculations. The default value may be −1.0e30.

UAV—Upper Acceptable Value—determines the upper range for a register value to be included into statistic calculations. The default value may be +1.0e30.

LHL—Lower Hold Limit—determines the acceptable smallest statistic value (or percentage for fail, open, short, range) that can be encountered without flagging a hold condition. Hold condition will be flagged if statistic is less than the limit. The default value is −1.0e30.

UHL—Upper Hold Limit—determines the acceptable greatest statistic value (or percentage for fail, open, short, range) that can be encountered without flagging a hold condition. Hold condition will be flagged if statistic is greater than the limit. The default value is +1.0e30.

LT—Lot Tracking register number specifies if the lot tracking is supported. The executive will generate the track files (*.TRK) and include statistics with specified LT number. This file will be sent after a lot run test completes to the lot tracking database. Lot tracking is available for all statistics. In an embodiment, the lot tracking register number is optional.

Fail specifies that a percentage of all failures to be performed. In an embodiment, a state of failure is determined by the fact that the register value is greater or equal than UAV or lower or equal than LAV or equal to 998.0. A hold condition will be flagged if the percentage of failures is less or equal than LHL or greater or equal than UHL.

For example: fail=.01, 10,, 5.

Open specifies that a percentage of all opens to be performed. A state of open is determined by the fact that the register value is greater or equal to UAV. A hold condition will be flagged if the percentage of opens is less or equal than LHL or greater or equal than UHL. For example: open=, 100.0, 10, 80.

Short specifies that a percentage of all shorts to be performed. A state of short is determined by the fact that the register value is less or equal to LAV. A hold condition will be flagged if the percentage of opens is less or equal than LHL or greater or equal than UHL. For example: short=100.0, 10, 80.

Range specifies that a percentage of all values in the specified range is to be performed. A state of falling in the specified range is determined by the fact that the register value is between LAV and UAV. A hold condition will be flagged if the percentage of all values in the specified range is less or equal than LHL or greater or equal to UHL. For example: range=100.0, 200.0, 10, 80.

Mean specifies that a mean calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: mean=, 3.6, 4.6, 1223.

Median specifies that a median calculation will be done on the data. In an embodiment, the calculation excludes all values of 998.0, 999.0, and −999.0. The data is included in the calculation if it is between LAV and UAV. A hold condition will be flagged if the final calculation is outside of the LHL and UHL limits or equal to them.

For example: median=, 200.0, 100.0, 1000, 435.

Stddev specifies that a standard deviation calculation will be done on the data. In an embodiment, the calculation excludes all values of 998.0, 999.0, and −999.0. The data is included in the calculation if it is between LAV and UAV. A hold condition will be flagged if the final calculation is outside of the LHL and UHL limits or equal to them. For example: stddev=, 125.8,, 20.0.

Total specifies that a total calculation will be done on the data. In an embodiment, the calculation excludes all values of 998.0, 999.0, and −999.0. The data is included in the calculation if it is between LAV and UAV. A hold condition will be flagged if the final calculation is outside of the LHL and the UHL limits or equal to them. For example: total=,,,,.

Iqr specifies that a IQR calculation will be done on the data. In an embodiment, the calculation excludes all values of 998.0, 999.0, and −999.0. The data is included in the calculation if it is between LAV and UAV. A hold condition will be flagged if the final calculation is outside of the LHL and UHL limits or equal to them.

For example: iqr=,, 100, 200.

Min specifies that a minimum calculation will be done on the data. In an embodiment, the calculation excludes all values of 998.0, 999.0, and −999.0. The data is included in the calculation if it is between LAV and UAV. A hold condition will be flagged if the final calculation is outside of the LHL and UHL limits or equal to them.

For example: min=, 100,, 50.

Max specifies that a maximum calculation will be done on the data. In an embodiment, the calculation excludes all values of 998.0, 999.0, and −999.0. The data is included in the calculation if it is between LAV and UAV. A hold condition will be flagged if the final calculation is outside of the LHL and UHL limits or equal to them.

For example: max=100,,, 200.

The badsite keyword specifies that a bad site counter is to be kept for the Register. Each Measurement acquired from the Parametric Measurement System is identified by one Register. Compared to traditional statistics keywords, the badsite keyword has a different format and meaning:

For example:
    badsite=PAUSE, 5, 3, UPDATE, 123,
    badsite=, 10,,, 124
    badsite=PAUSE, 5, 3, UPDATE, 123,
    badsite=PAUSE, 5, 3, UPDATE, 123,
    badsite=PAUSE, 5, 3, UPDATE, 123, Parameter 1

Parameter 1 specifies whether the Parametric Inline Engine Control (PEC) should pause if the maximum percentage threshold of bad sites per wafer is met (PAUSE or NOPAUSE). PIEC is an instance of the engine control 101. In an embodiment, the default is NOTPAUSE. A test site is considered bad when the register value is not within limits.

Parameter 2

Parameter 2 specifies the bad site percentage threshold. In an embodiment, the default is >100%.

Parameter 3

Parameter 3 specifies the number of retries for the bad site counter reaching the specified bad site percentage threshold before the executive will lock the test flow. In an embodiment, the default is 0, which is never lock.

Parameter 4

The parameter 4 field specifies whether the bad wafer counter would be updated if bad site threshold is met (UPDATE or NOUPDATE). In an embodiment, the default is NOUPDATE. The fifth optional field is Lot Tracking register number.

Parameter 5

The parameter 5 field represents the Lot Tracking Register Number. In an embodiment, parameter 5 is optional and is not represented in the test plan if not supplied. If this parameter is not populated, no default value is given.

Parameter 6

Parameter 6 was created to represent the badsite Hold Limit. In an embodiment, parameter 6 is not used, regardless of whether it is populated.

Badwafer specifies that a bad wafer counter is to be kept for the register. Parameters that are specified for the badwafer keyword have different formats and meanings than other statistics. The first parameter specifies whether the executive should pause if the maximum percentage threshold of bad wafers per lot is met (PAUSE or NOPAUSE). In an embodiment, the default is NOTPAUSE. A test wafer may be considered bad when any test site is bad for a given register. The second parameter specifies the bad wafer percentage threshold. In an embodiment, the default is >100%. The third parameter specifies the bad wafer threshold that will prompt the executive to lock the test flow. In an embodiment, the default is >100%. In an embodiment, the fourth field is reserved. The fifth optional field is Lot Tracking register number. In an embodiment, a badsite statistic must be specified for each badwafer statistic.

For example:
    badwafer=PAUSE, 10, 50,, 123
    badwafer=PAUSE, 10,,, 124

NOTE: Both badsite and badwafer keywords have complex behavior.

Figure 3:
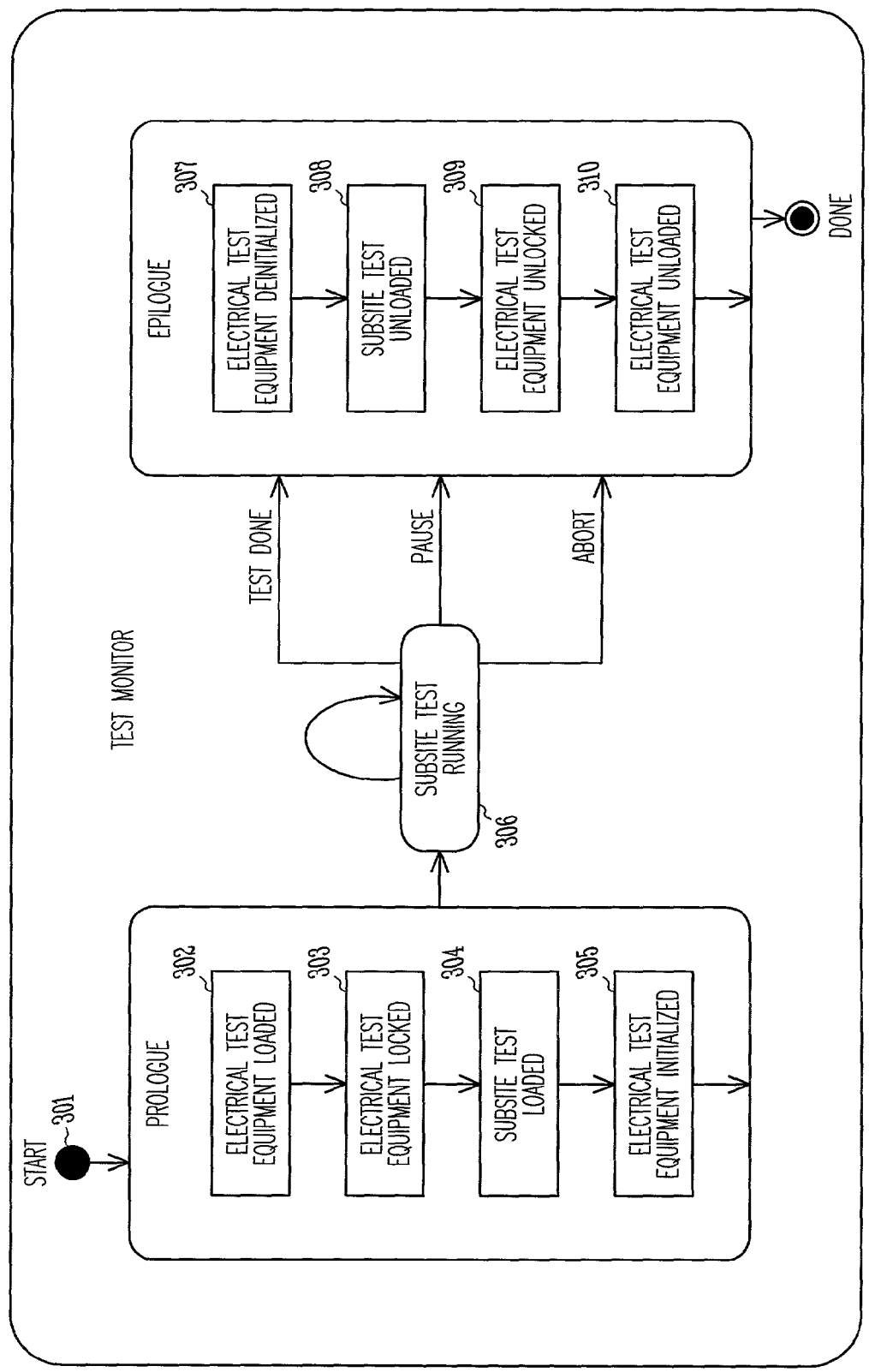
FIG. 3 illustrates a composite state diagram of a test monitor module in a semiconductor parametric test system, consistent with an embodiment of the present invention.

FIG. 3 illustrates via a Unified Modeling Language state diagram how the test monitor 103 of one specific implementation of the present invention operates. First, at start 301 the engine control module shown at 101 of FIG. 1 initiates test monitor module operation. The electrical test equipment is loaded and locked at 302 and 303, and the subsite test for the wafer subsite to be tested is loaded at 304. At 305, the electrical test equipment is initialized and brought to a state ready to begin the subsite test. At 306, the subsite test executes for one or more subsites on the wafer, until the tests are completed, the testing is paused, or the testing is aborted. When an event such as an abort happens, the electrical test equipment is deinitialized at 307 and the subsite test is unloaded at 308. Then, the electrical test equipment is unlocked and unloaded from test monitor module control. A pause need not, but can in some embodiments of the invention result in deinitialization of test equipment at 307, unloading of a subsite test at 308, unlocking electrical test equipment at 309, and unloading electrical test equipment at 310. This is done in some embodiments of the invention to protect the wafer under test from a system pause in a state where current or voltage is applied to part of the wafer.

This example illustrates how a pluggable module such as a test monitor 103 of FIG. 1 can perform complex predefined tasks such as are discussed in conjunction with FIG. 2 at the direction of the engine control module 101, while allowing configuration of the rest of the parametric test system to remain independent of a pluggable and replaceable module. The pluggable modules illustrated in FIG. 1 can independently perform complex functions as shown in FIGS. 2 and 3 at the direction of the engine control module, and can provide data back to the engine control module such as through the subscribed example illustrated in FIG. 4.

Figure 4:
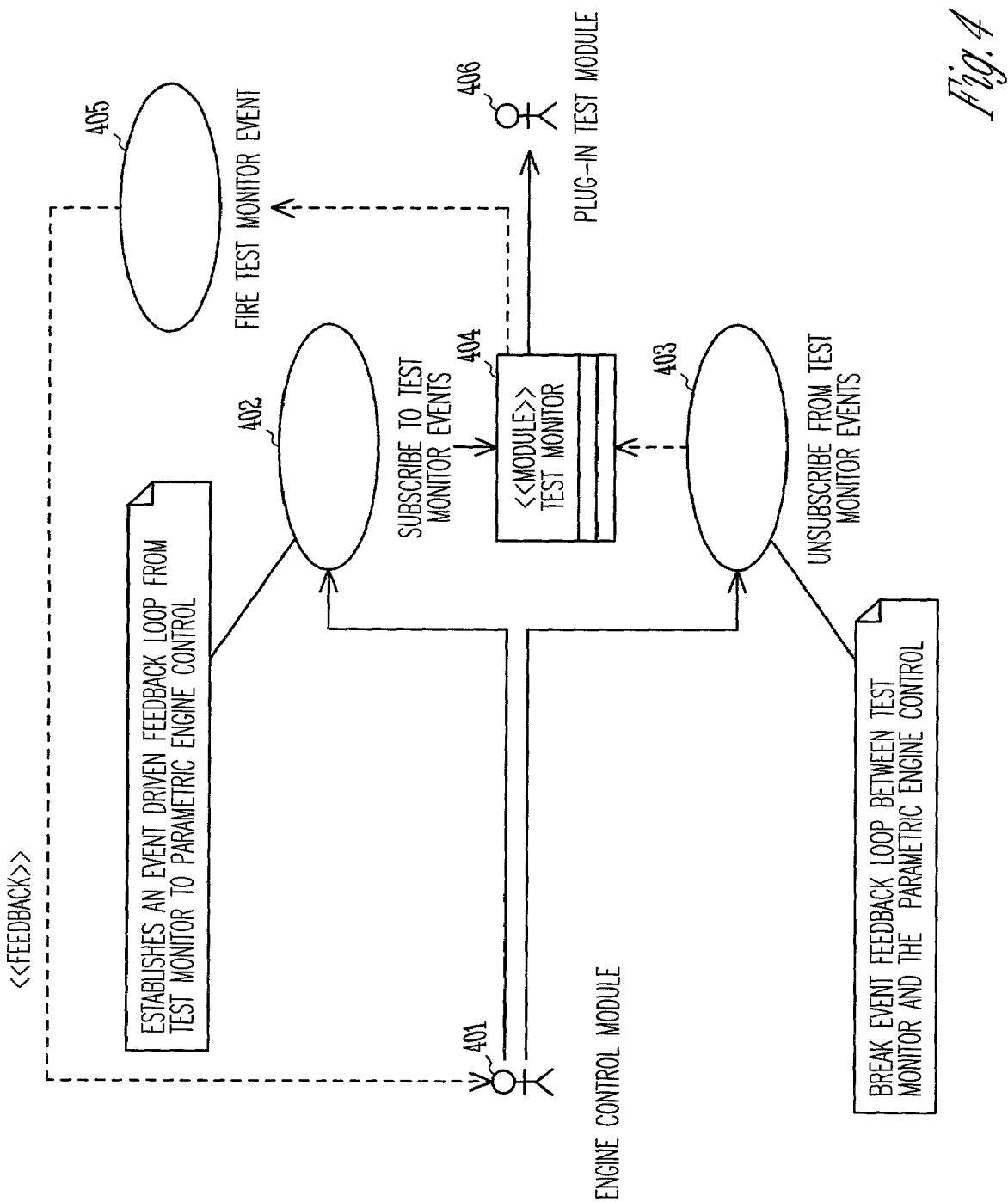
FIG. 4 illustrates a test monitor module use case diagram for a semiconductor parametric test system, consistent with an embodiment of the present invention.

FIG. 4 shows a use case diagram further illustrating interaction between the engine control module 101 and the test monitor 103 of FIG. 1 in an example embodiment of the invention. The diagram is again produced as part of a Unified Modeling Language implementation of an embodiment of the present invention. The engine control module 401 is operable to subscribe to test monitor modules at 402, and to unsubscribe to test monitor events at 403. The engine control module 401 is here shown as an actor. The engine control module 401 is represented as a person in Unified Modeling Language because it represents an actor that acts upon other elements of the state diagram. The test monitor module 404 is again operable to control a measurement module such as is shown at 107 in FIG. 1, which provides an interface to the actual test hardware. If the engine control module 401 has subscribed to an event that the test monitor module monitors, the test monitor event is fired or reported to the engine control module 401 as shown at 405. The engine control module 401 therefore need not poll or constantly monitor the state of the test monitor module 404 of the embodiment shown here, but can subscribe to and receive notification of specific events from the test monitor module and from other such pluggable modules.

Although this example illustrates operation of the test monitor module 404, the engine control module 401 operates upon and communicates with a variety of other pluggable modules in various embodiments of the present invention.

Figure 5:
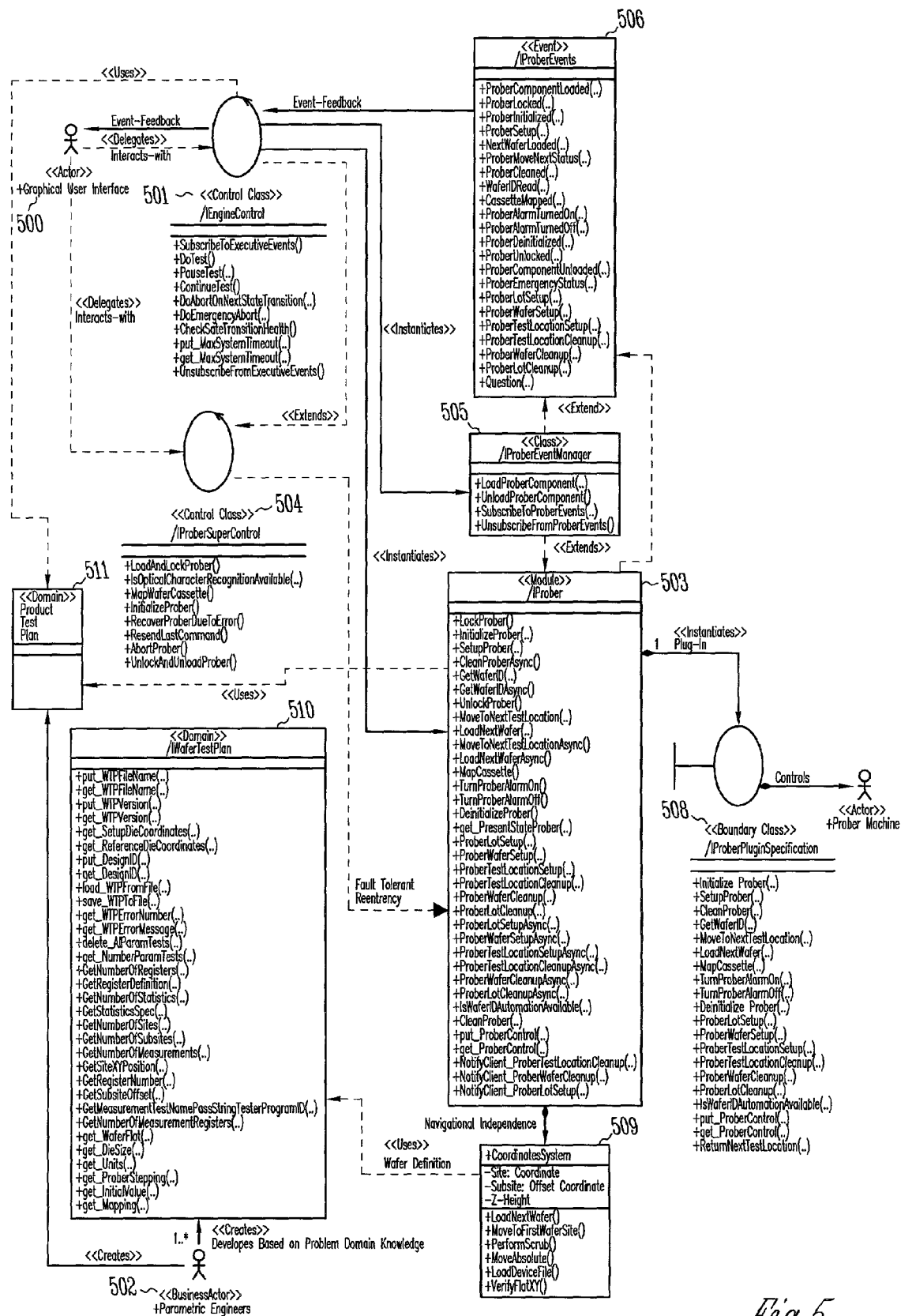
FIG. 5 illustrates a class diagram for an interface to a prober module, consistent with an embodiment of the present invention.

FIG. 5 illustrates a class diagram for an interface to a prober module, consistent with an embodiment of the present invention. The interface may include a graphical user interface 500, an IEngineControl 501, Parametric Engineers 502, an Iprober 503, an IProberSuperControl 504, an IProberEventManager 505, an IProberEvents 506, an IProberPlugInSpecification 508, a CoordinatesSystem 509, and an IWaferTestPlan 510.

A Parametric Test Tools (PTT) package helps fabrication parametric engineers design, write, and analyze tests. It also allows users to simultaneously probe and make electrical measurements. The Graphical User Interface 500 is an implementation of the Parametric Test Tools and in an embodiment may include two software tools: the Test and Development Tool (TDT) and the Parametric Shell Executive Graphical User Interface (PSEGUI). The Test Development Tool may be a menu-driven tool that allows fabrication engineers to develop files to describe and run bench tests. The Test and Development Tool tests the product, wafer, and test DLLs created by a test engineer on a computer and produces files necessary for analysis. PSEGUI uses the test files produced by the Test and Development Tool to delegate control tasks to the IEngineControl 501, which in turn delegates the task of prober control and parametric electrical test to the Prober Monitor 108 (FIG. 1) and the Test Monitor 103 (FIG. 1), respectively.

A Parametric Engineer 502 may be a semiconductor engineer who has experience in Inline-Parametric testing of a die on a wafer. The Parametric Engineer 502 may develop a Wafer Test Plan 508.

The interface, IProberSuperControl 504, may provide reentrant supervisory control over the asynchronous interface, IProber 503. Often Prober Machine errors occur at run-time, and these errors may be recovered from. The Engine Control 501 uses the IProberSuperControl 504 during automated wafer lot runs. Furthermore, the IProberSuperControl 504 is extended back to the Graphical User Interface 500 for user interactive recovery of a prober error. The key hardware actors, Parametric Tester and Prober Monitor, may both leverage the same Modeless Super Control Dialog.

While the Prober is initializing at the start of a Lot Run, the user may be provided the ability to Recover, Re-Send, or Abort the prober. If the user notices a communication protocol error (e.g., a GPIB ERROR) on the Probe's console 503, then the user may attempt to clear the communication protocol error by using the Recover function. If the user is unsuccessful with getting the Prober to recover, then in an embodiment the user may have three remaining options: Re-send the last prober command, Abort the Prober, or do an Emergency Abort. Re-sending the last prober command is a high-risk option if the user is in the middle of the test because re-sending the last prober command could cause the prober to move to a location on the wafer that is not part of the prescribed Wafer Test Plan (WTP). Therefore, wafer product could be damaged. Initiating an Abort function would require the operator to re-start the Lot validation sequence. The Emergency Abort terminates all the software processes that make up the PSEGUI system, but an Emergency Abort does not reset, power off, or power on the physical hardware subsystems such as the Parametric Tester and Prober. Looking forward, a new instance of processes will initialize subsystems.

The IProberEventManager 505 notifies the Engine Control 501 when the operation has completed successfully or unsuccessfully.

The interface, IProberEventManager 505, enables the client, Engine Control 501, to subscribe to prober events at the start of each lot run and then unsubscribe from prober events after the lot run completes.

The Engine Control 501 resides in a separate process from the Prober 503. Likewise, the Graphical User Interface 500 is in a separate process. Therefore, in an embodiment, event feedback may be used for interprocess communications. In an embodiment, Dual Event Paths (DEP) may be used between the client and server, which uses two redundant paths. For example, in an embodiment, the C++ language may be used and the Engine Control 501 supplies a raw callback pointer and advanced connections points are used. Connections points are supported, for example, by Microsoft's ATL Connection Points. This approach provides the Engine Control 501 with the needed stimulus and ensures fault-tolerant concurrent synchronization.

The IProberEvents 506 reflect the past tense of the IProber 503 operations that have occurred. For example, the client invokes IProber's LockProber and the IProberEvent 506 fires the Probe Locked event back to the client. In this example, the client is the Engine Control 501. The IProber 503 is an abstract interface for controlling all types of plug-in Probers.

The internal IProberPlugInSpecification 508 is implemented to address the specific requirements of the brand of Prober, yet it adheres to the abstract prober interface.

The Coordinate System 509 is a class, which provides a means of navigational independence from the implementation of the Prober Machine's 503 native 3-D {x, y, z} coordinates system. The implementation of the Coordinate System 509 may adhere to the Wafer Test Plan Specification 510. The Coordinate System 509 may use the wafer definition to determine where the setup die is located on the wafer and to determine which die location to step to next.

The Coordinate System class 509 may support two kinds of horizontal (x, y) movement: Absolute and Relative. The Coordinate System class 509 also may support vertical height (z-axis) movement.

An Absolute move may address the Site. In an embodiment, the smallest resolution that the Coordinate System 509 may calculate is a relative offset from the Absolute move.

A Relative move may address the atomic subsite location on the die. The Subsite is a region inside the Site. In an embodiment, each relative move with respect to the absolute site may be in micron/mils steps.

The Wafer Test Plan (WTP) 510 allows the parametric engineer 502 to develop a test plan for a wafer. The Wafer Test Plan 510 shows sites to be tested. The parametric engineers 502 may add test sites directly on a graphical display. The Test and Development Tool then automatically adds the test sites to the text file. The Wafer Test Plan 510 describes tests (for example, resistance) on Subsites within the test site. The Wafer Test Plan 510 may give an explicit description of each measurement to be made and the register number in which the data will be stored. The Wafer Test Plan 510 may also describe units of measure, as well as upper and lower limits for values.

The Product Test Plan (PTP) 511 allows the parametric engineers 502 to develop a test plan for a product line (for example, 64MB DRAM). The Product Test Plan provides test setting information to the prober and engine control. In an embodiment, there is one Product Test Plan per part type.

The modules in some embodiments of the invention are implemented in software executing on a computerized system, and in other embodiments are implemented in hardware, another combination of hardware and software, or in any other way designed to be consistent with the present invention as claimed.

The pluggable modules of the present invention that operate independently under control of the engine control module also facilitate in some embodiments of the invention concurrent operation and control of various parts of the parametric test system. For example, a test monitor module can in some embodiments of the invention load tests, initialize registers, and perform other functions while semiconductor test equipment such as a wafer handler and a prober prepare a new wafer for test and move probe pins to the next site or subsite. This concurrent operation enables realization of a reduction in the amount of time taken to perform semiconductor parametric testing, and results in a more efficient and rapid parametric test process.

Some or all of the invention can be embodied as software or machine-readable code operable to cause a machine to perform certain functions consistent with the present invention. One such example is software stored on a machine-readable medium such as a diskette or hard disk drive, but the invention is not so limited.

Further embodiments of the present invention comprise parametric test equipment modules operable to facilitate control of various other semiconductor parametric test equipment, such as wafer loader, a wafer positioner, a wafer chuck, a wafer tray loader, or a prober. Pluggable test instrumentation modules are utilized to facilitate control of such parametric test instrumentation hardware, such as a test probe or a semiconductor test parameter module.

Conclusion

By utilizing reusable software components to provide an interface to the test equipment and test instrumentation in some embodiments of the invention, the task of creating tests or other operations that interface with these hardware components is greatly simplified. Such a control approach also facilitates use of different hardware components, as only the pluggable module associated with a new hardware component need be replaced for use with different equipment.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims and the full scope of equivalents thereof.

We claim:

1. A modular semiconductor parametric test system, comprising:
    an engine control module, operable to communicate with a user via a user interface and further operable to communicate with and to control the state of at least one other module in the semiconductor parametric test system, wherein the at least one other module comprises at least one pluggable module, and wherein at least one other module is operable to test at least a portion of a semiconductor wafer or die;
    and wherein the engine control module is operable to communicate with and control the state of the at least one other module via a supercontrol, the supercontrol operable to change the state of a deadlocked at least one other module.

2. A modular semiconductor parametric test system, comprising:
    an engine control module, operable to communicate with a user via a user interface and further operable to communicate with and to control the state of at least one other module in the semiconductor parametric test system,
    wherein the at least one other module comprises a test monitor module,
    wherein the test monitor module provides an interface between the engine control module and a measurement module, and
    wherein the measurement module comprises a lockout mechanism that is operable to halt testing of a wafer based on augmented test data in the measurement module.

3. A modular semiconductor parametric test system, comprising:
    an engine control module, operable to communicate with a user via a user interface and further operable to communicate with and to control the state of at least one other module in the semiconductor parametric test system,
    wherein the at least one other module comprises a test monitor module,
    wherein the test monitor module provides an interface between the engine control module and a measurement module, and
    wherein the measurement module comprises a lockout that is operable to halt testing of a wafer lot based on augmented test data in the measurement module.

4. A modular semiconductor parametric test system, comprising:
    an engine control module, operable to communicate with a user via a user interface and further operable to communicate with and to control the state of at least one other module in the semiconductor parametric test system, wherein the at least one other module comprises a test monitor module, and wherein the test monitor module is operable to perform a controlled abort in which subsite tests in progress for at least one wafer or die complete before the test aborts.

5. A modular semiconductor parametric test system, comprising:
    an engine control module, operable to communicate with a user via a user interface and further operable to communicate with and to control the state of at least one other module in the semiconductor parametric test system, wherein the at least one other module comprises a test monitor module, and wherein the test monitor module is operable to perform an emergency abort in which testing for at least one wafer or die is immediately aborted irrespective of the current test state.

6. A method of controlling a modular semiconductor parametric test system, comprising:
    communicating with a user via user interface linked to an engine control module;
    communicating with at least one other module in the semiconductor parametric test system via the engine control module, where the at least one other module is a pluggable module, and wherein at least one other module is operable to test at least a portion of a semiconductor wafer or die;
    and controlling the state of the at least one other pluggable module in the semiconductor parametric test system via the engine control module;
    wherein the engine control module is operable to communicate with and control the state of the at least one other module via a supercontrol, the supercontrol operable to change the state of a deadlocked at least one other module.

7. A method of controlling a modular semiconductor parametric test system, comprising:
    communicating with a user via a user interface linked to an engine control module;
    communicating with a pluggable test monitor module in the semiconductor parametric test system via the engine control module; and
    controlling the state of the pluggable test monitor module in the semiconductor parametric test system via the engine control module,
    wherein the pluggable test monitor module provides an interface between the engine control module and a measurement module, and
    wherein the measurement module comprises a lockout mechanism that is operable to halt testing of a wafer based on augmented test data in the measurement module.

8. A method of controlling a modular semiconductor parametric test system, comprising:
  communicating with a user via a user interface linked to an engine control module;
  communicating with a pluggable test monitor module in the semiconductor parametric test system via the engine control module; and
  controlling the state of the pluggable test monitor module in the semiconductor parametric test system via the engine control module,
  wherein the pluggable test monitor module provides an interface between the engine control module and a measurement module, and
  wherein the measurement module comprises a lockout that is operable to halt testing of a wafer lot based on augmented test data in the measurement module.

9. A method of controlling a modular semiconductor parametric test system, comprising:
  communicating with a user via a user interface linked to an engine control module;
  communicating with a pluggable test monitor module in the semiconductor parametric test system via the engine control module;
  and controlling the state of the pluggable test monitor module in the semiconductor parametric test system via the engine control module, wherein the pluggable test monitor module is operable to perform a controlled abort in which subsite tests in progress for at least one wafer or die complete before the test aborts.

10. A method of controlling a modular semiconductor parametric test system, comprising:
  communicating with a user via a user interface linked to an engine control module;
  communicating with a pluggable test monitor module in the semiconductor parametric test system via the engine control module;
  and controlling the state of the pluggable test monitor module in the semiconductor parametric test system via the engine control module, wherein the pluggable test monitor module is operable to perform an emergency abort in which testing for at least one wafer or die is immediately aborted irrespective of the current test state.

11. A machine-readable medium with instructions stored thereon, the instructions when executed operable to cause a modular semiconductor parametric test system to perform functions comprising:
  communicating with a user via user interface linked to an engine control module;
  communicating with at least one other module in the semiconductor parametric test system via the engine control module, where the at least one other module is a pluggable module; and
  controlling the state of the at least one other pluggable module in the semiconductor parametric test system via the engine control module,
  wherein the engine control module is operable to communicate with and control the state of the at least one other module via a supercontrol, the supercontrol operable to change the state of a deadlocked at least one other module.

12. A machine-readable medium with instructions thereon, the instructions when executed operable to cause a modular semiconductor parametric test system to perform functions comprising:
  communicating with a user via a user interface linked to an engine control module;
  communicating with a test monitor module in the semiconductor parametric test system via the engine control module; and
  controlling the state of the test monitor module in the semiconductor parametric test system via the engine control module,
  wherein the test monitor module provides an interface between the engine control and a measurement module, and
  wherein the measurement module comprises a lockout mechanism that is operable to halt testing of a wafer based on augmented test data in the measurement module.

13. A machine-readable medium with instructions thereon, the instructions when executed operable to cause a modular semiconductor parametric test system to perform functions comprising:
  communicating with a user via a user interface linked to an engine control module;
  communicating with a test monitor module in the semiconductor parametric test system via the engine control module; and
  controlling the state of the test monitor module in the semiconductor parametric test system via the engine control module,
  wherein the test monitor module provides an interface between the engine control and a measurement module, and
  wherein the measurement module comprises a lockout that is operable to halt testing of a wafer lot based on augmented test data in the measurement module.

14. A machine-readable medium with instructions thereon, the instructions when executed operable to cause a modular semiconductor parametric test system to perform functions comprising:
  communicating with a user via a user interface linked to an engine control module;
  communicating with a test monitor module in the semiconductor parametric test system via the engine control module;
  and controlling the state of the test monitor module in the semiconductor parametric test system via the engine control module, and wherein the test monitor module is operable to perform a controlled abort in which subsite tests in progress for at least one wafer or die complete before the test aborts.

15. A machine-readable medium with instructions thereon, the instructions when executed operable to cause a modular semiconductor parametric test system to perform functions comprising:
  communicating with a user via a user interface linked to an engine control module;
  communicating with a test monitor module in the semiconductor parametric test system via the engine control module;
  and controlling the state of the test monitor module in the semiconductor parametric test system via the engine control module, and wherein the test monitor module is operable to perform an emergency abort in which testing for at least one wafer or die is immediately aborted irrespective of the current test state.

* * * * *